(12) United States Patent
Zhao et al.

(10) Patent No.: US 11,789,309 B2
(45) Date of Patent: Oct. 17, 2023

(54) LED BACKLIGHT MODULE AND DISPLAY DEVICE

(71) Applicant: FOSHAN NATIONSTAR OPTOELECTRONICS CO., LTD, Foshan (CN)

(72) Inventors: Qiang Zhao, Guangdong (CN); Kuai Qin, Guangdong (CN); Heng Guo, Guangdong (CN); Kailiang Fan, Guangdong (CN)

(73) Assignee: FOSHAN NATIONSTAR OPTOELECTRONICS CO., LTD., Guangdong (CN)

( * ) Notice: Subject to any disclaimer, the term of this patent is extended or adjusted under 35 U.S.C. 154(b) by 55 days.

(21) Appl. No.: 17/629,410

(22) PCT Filed: Jun. 29, 2020

(86) PCT No.: PCT/CN2020/099014
§ 371 (c)(1),
(2) Date: Jan. 24, 2022

(87) PCT Pub. No.: WO2021/027415
PCT Pub. Date: Feb. 18, 2021

(65) Prior Publication Data
US 2022/0260876 A1 Aug. 18, 2022

(30) Foreign Application Priority Data
Aug. 9, 2019 (CN) .......................... 201910732341.0

(51) Int. Cl.
*G02F 1/13357* (2006.01)
*H01L 27/15* (2006.01)
(Continued)

(52) U.S. Cl.
CPC .. *G02F 1/133603* (2013.01); *G02F 1/133612* (2021.01); *H01L 27/156* (2013.01); *H01L 33/56* (2013.01); *H01L 33/62* (2013.01)

(58) Field of Classification Search
CPC ........................... G02F 1/133612; H01L 33/62
See application file for complete search history.

(56) References Cited

U.S. PATENT DOCUMENTS

| 8,651,690 B2 * | 2/2014 | Wu | H05K 3/3452 |
| | | | 362/609 |
| 2009/0001404 A1 * | 1/2009 | Ohata | H01L 33/647 |
| | | | 438/26 |

(Continued)

FOREIGN PATENT DOCUMENTS

| CN | 202503815 U | 10/2012 |
| CN | 205160606 U | 4/2016 |

(Continued)

*Primary Examiner* — Andrew J Coughlin
(74) *Attorney, Agent, or Firm* — Yu Gang

(57) ABSTRACT

Some embodiments of the present disclosure disclose an LED backlight module and a display device, a plurality of light-emitting units are distributed on a substrate of the LED backlight module, and the surface of the substrate is provided with a plurality of solder mask window areas for the plurality of light-emitting units to abut against, and a conductive circuit connecting two adjacent light-emitting units includes a main circuit and an auxiliary circuit; a remaining portion of the substrate except for the solder mask window area is coated with an insulating material, an alignment error in the coating process causes the reserved solder mask window area to be covered and an actual solder mask window area to shift, since the auxiliary circuit passes through the solder mask window area and a routing-wiring direction is intersected the connecting-wiring direction of the two electrodes of the light-emitting units.

20 Claims, 6 Drawing Sheets

(51) Int. Cl.
*G02F 1/1335* (2006.01)
*H01L 33/56* (2010.01)
*H01L 33/62* (2010.01)

(56) References Cited

U.S. PATENT DOCUMENTS

2017/0185181 A1\* 6/2017 Kim .................. G06F 3/0412
2018/0233493 A1\* 8/2018 Kawai ................ G02B 6/0083

FOREIGN PATENT DOCUMENTS

| | | |
|---|---|---|
| CN | 207123684 U | 3/2018 |
| CN | 108828841 A | 11/2018 |
| CN | 208175099 U | 11/2018 |
| CN | 108983497 A | 12/2018 |
| CN | 109166867 A | 1/2019 |
| CN | 109757032 A | 5/2019 |
| CN | 110456570 A | 11/2019 |
| KR | 100985481 B1 | 10/2010 |
| KR | 20100136031 A | 12/2010 |

\* cited by examiner

LED BACKLIGHT MODULE AND DISPLAY DEVICE

CROSS-REFERENCE TO RELATED APPLICATION

The present disclosure claims priority to Chinese Patent Application No. 201910732341.0, filed to the China National Intellectual Property Administration on Aug. 9, 2019 and entitled "LED Backlight Module and Display Device".

TECHNICAL FIELD

The present disclosure relates to a field of Liquid Crystal Display (LCD) and Light-Emitting Diode (LED) display, and in particular to an LED backlight module and a display device.

BACKGROUND

As people's requirements for display experience become higher and higher, advanced displays generally use curved or even bendable screens. Traditional Liquid Crystal Display (LCD) backlight is a long and narrow backlight strip with a relatively high degree of flexibility. However, with a maturity of micro blue light-emitting Diode (LED) chip and the direct-type backlight local dimming technology, the technology of using micro LED as the backlight source is gradually popularized, and the backlight strip gradually develops into a mini LED backlight panel. Current curved LCD screen mainly adopts an arc-shaped side-emitting backlight strip to provide a light source, a linear light source is converted to a planar light source through a light guide panel, therefore it is difficult to achieve fine local dimming, the power consumption is relatively high under continuous lighting, and the side temperature of the LCD light strip is high.

If a bendable direct-type mini-LED planar light source is adopted, on the one hand display requirements of curved surface bending can be achieved; on the other hand the very fine local dimming can be done to achieve ultra-high contrast. At present, the mini LED backlight panel generally adopts a flip Chips-on-Board (COB) structure, which is commonly soldered with solder paste, a soldering tin is generally brittle, and there are problems that the soldering is not strong and not easy to be stressed.

FIG. 1 and FIG. 2 respectively show schematic diagrams of normal window and poor window of a conductive circuit in the related art, a wiring direction of the existing conductive circuit and a wiring direction of two electrodes of light-emitting units are parallel to each other. In a substrate manufacturing process, an insulating white oil needs to be coated on a non-bonding pad portion of the substrate (i.e. a portion of a non-soldering mask window area). When an alignment error occurs in the insulating white oil coating process, an original preset solder mask window area will shift, resulting in that the bonding pad is not detected during optometry, and thus causing the die bonding failure.

SUMMARY

The objective of the present disclosure is to provide a light-emitting Diode (LED) backlight module and a display device for ensuring successful die bonding during optometry.

The technical solution adopted by the present disclosure is as follows.

An LED backlight module includes a substrate, a plurality of light-emitting units disposed on the substrate. A surface of the substrate is provided with a plurality of solder mask window areas for the plurality of light-emitting units to abut against, the plurality of light-emitting units and the plurality of solder mask window areas are disposed in an one-to-one corresponding manner, each of the plurality of solder mask window areas is internally provided with two bonding pads connected with two electrodes of a corresponding the light-emitting units in the plurality of light-emitting units respectively, a plurality of conductive circuits are disposed on the substrate, each of the plurality of conductive circuits is connected with two adjacent light-emitting units in the plurality of light-emitting units, each of the plurality of conductive circuits includes a main circuit and two auxiliary circuits connected with the main circuit, each of the two auxiliary circuits is extended from one side of a corresponding solder mask window area to the other side of the corresponding solder mask window area and a routing-wiring direction of the each of the two auxiliary circuits is intersected with a connecting-wiring direction of the two electrodes of the light-emitting unit, each bonding pad is located on a corresponding auxiliary circuit.

In some embodiments of the present disclosure, the routing-wiring direction of the each of the two auxiliary circuits in each of the plurality of conductive circuits is perpendicular to the connecting-wiring direction of the two electrodes of the corresponding light-emitting unit.

In some embodiments of the present disclosure, a length of each of the two auxiliary circuits in each of the plurality of conductive circuits is at least 1.2 times a length of an electrode of each of the plurality of light-emitting units; and a width of each of the two auxiliary circuit is at least 1.2 times a width of the electrode of each of the plurality of light-emitting units.

In some embodiments of the present disclosure, the substrate is bent in a preset direction, a horizontal direction where a radian of the substrate changes after bending is a bending direction of the substrate, a connecting-wiring direction of the two electrodes of each of the plurality of light-emitting units is perpendicular to the bending direction of the substrate, and a connecting-wiring of the two electrodes of each of the plurality of light-emitting units is located on a curved surface where the substrate is located.

In some embodiments the present disclosure, each of the plurality of light-emitting units is respectively covered and packaged with a packaging adhesive respectively.

In some embodiments of the present disclosure, the plurality of light-emitting units are arranged in a rectangular or isosceles triangle array on the substrate, and adhesive paths of the packaging adhesives covering on light-emitting units arranged in the connecting-wiring direction of the two electrodes of the light-emitting unit are connected in an end-to-end manner.

In some embodiments of the present disclosure, a material of the packaging adhesive is silicone or epoxy resin.

In some embodiments of the present disclosure, an area of each of the plurality of solder mask window area is larger than a cross-sectional area of a corresponding light-emitting unit in the plurality of light-emitting units.

In some embodiments of the present disclosure, a length of the solder mask window area is 20 µm to 100 µm larger than a length of the corresponding light-emitting unit; and a width of the solder mask window area is 20 µm to 100 µm larger than a width of the corresponding light-emitting unit.

In some embodiments of the present disclosure, the substrate adopts a copper clad plate; a base material of the copper clad plate is thermosetting epoxy resin or polyimide, and a reinforcing material is glass fiber or carbon fiber.

In some embodiments of the present disclosure, a thickness of the copper clad plate is less than or equal to 1.2 mm.

In some embodiments of the present disclosure, each of the light-emitting units adopts a dual-electrode chip.

A display device includes the above-mentioned LED backlight module.

The beneficial effects of the present disclosure: in the LED backlight module and the display device, a plurality of light-emitting units are distributed on the substrate of the LED backlight module, and the surface of the substrate is provided with a plurality of solder mask window areas for the light-emitting units to abut against, and the conductive circuit connecting two adjacent light-emitting units includes the main circuit and the auxiliary circuits; a remaining portion of the substrate except for the solder mask window area is coated with a insulating material, a alignment error in the coating process causes the reserved solder mask window area to be covered and the actual solder mask window area to shift, since the auxiliary circuit passes through the solder mask window area and the routing-wiring direction of the each of the auxiliary circuits is intersected with the connecting-wiring direction of the two electrodes of the light-emitting unit, the auxiliary circuit is disposed long enough to avoid large-area coverage, so that during optometry, the portion that is not covered by the insulating material is monitored to serve as the bonding pad for die bonding, which effectively avoids a occurrence of die bonding failure, and the quality and the performance of the LED backlight module are better improved.

BRIEF DESCRIPTION OF THE DRAWINGS

The present disclosure is further described below with reference to the accompanying drawings.

DETAILED DESCRIPTION OF THE EMBODIMENTS

Figure 1:
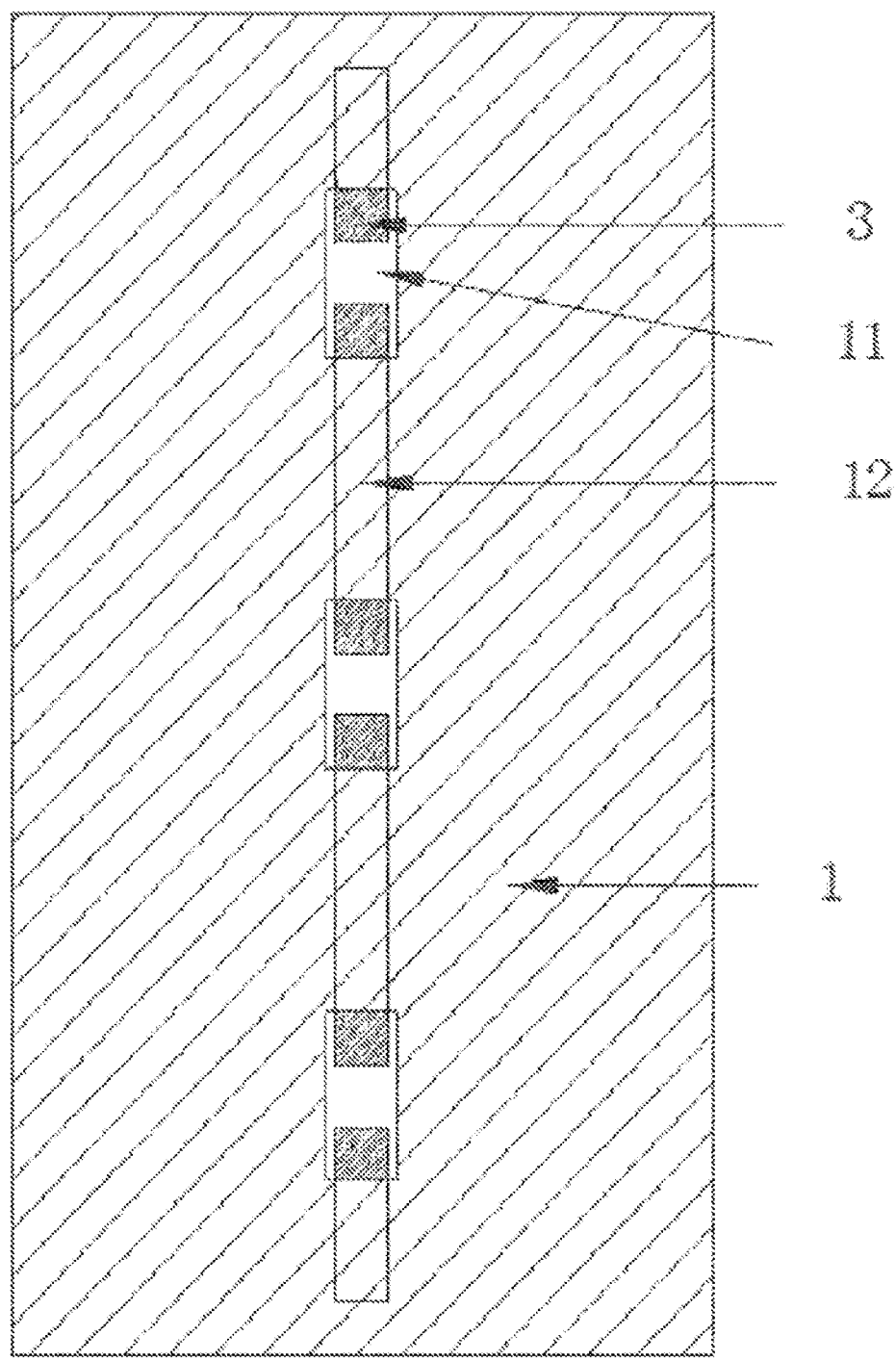
FIG. 1 illustrates a schematic diagram of normal window of a conductive line in the conventional art.

Embodiments of the present disclosure are described in detail below. Examples of the embodiments are shown in the accompanying drawings, in which the same or similar reference numerals denote the same or similar elements or the elements having the same or similar functions throughout. The embodiments described below by reference to the drawings are exemplary, are only used to explain the present disclosure, and cannot be understood as a limitation to the present disclosure.

Figure 2:
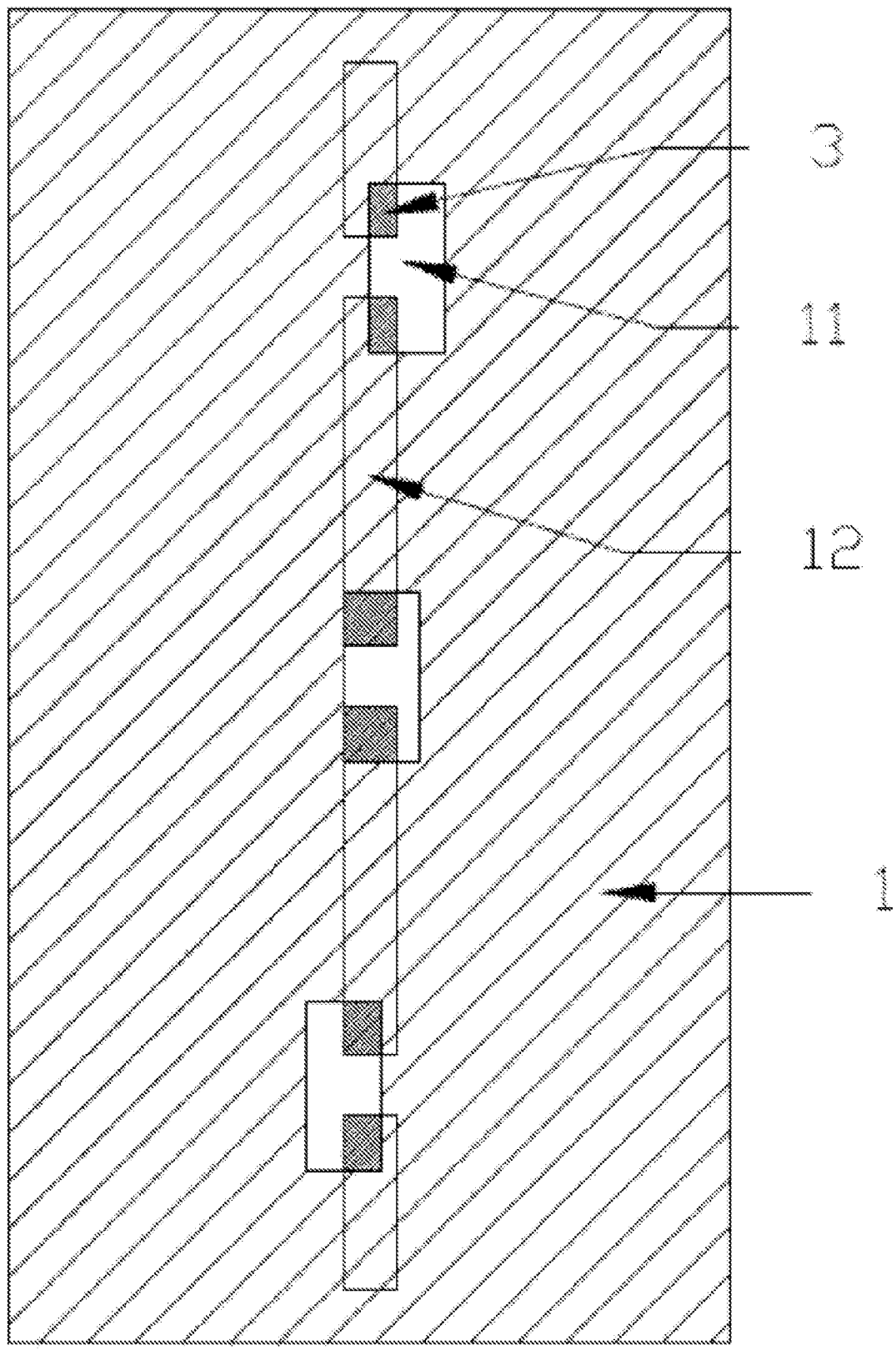
FIG. 2 illustrates a schematic diagram of poor window of a conductive line in the conventional art.

As shown in FIG. 1 and FIG. 2, in the conventional art, the routing-wiring direction of a conductive circuit 12 and the connecting-wiring direction of two electrodes of a light-emitting unit are parallel to each other; and in the manufacturing process of a substrate 1, insulating white oil needs to be coated on a non-bonding pad portion of the substrate 1. When an alignment error occurs in the white oil coating process, an original preset solder mask window area 11 will shift, so that it is difficult to detect the existence of a bonding pad 3 during optometry, thereby causing the die bonding failure.

Referring to FIG. 3 to FIG. 6, one of the embodiments of the present disclosure provides a Light Emitting Diode (LED) backlight module, which includes a substrate 1, a plurality of light-emitting units 2 disposed on the substrate 1, a surface of the substrate 1 is provided with a plurality of solder mask window areas 11 for the light-emitting units 2 to abut against, the plurality of light-emitting units 2 and the plurality of solder mask window areas 11 are disposed in an one-to-one corresponding manner, each of the plurality of solder mask window areas 11 is internally provided with two bonding pads 3 connected with two electrodes of a corresponding light-emitting units 2 in the plurality of light-emitting units respectively, a plurality of conductive circuits 12 are disposed on the substrate 1, each of the plurality of conductive circuits 12 is connected with two adjacent light-emitting units 2 in the plurality of light-emitting units, each of the plurality of conductive circuits 12 includes a main circuit 121 and two auxiliary circuits 122 connected with the main circuit 121, each of the two auxiliary circuits 122 is extended from one side of a corresponding solder mask window area 11 and a routing-wiring direction of the each of the two auxiliary circuits is intersected a connecting-wiring direction of the two electrodes of the light-emitting unit 2, each bonding pad 3 is located on a corresponding auxiliary circuit 122. In particular, in the each of the plurality of solder mask window areas 11, the two bonding pads 3 are located on two auxiliary circuit 122 of the two adjacent light-emitting units 2 in the plurality of light-emitting units separately.

In the LED backlight module, the plurality of light-emitting units 2 are distributed on the substrate 1, and the surface of the substrate 1 is provided with solder mask window areas 11 for the light-emitting units 2 to abut against, and the conductive circuit 12 connecting two adjacent light-emitting units includes the main circuit 121 and the auxiliary circuits 122; two ends of the main circuit 121 are respectively connected with the auxiliary circuits 122, the two auxiliary circuits 122 are located on the same side of the main circuit 121; the remaining portion of the substrate 1 except for the solder mask window areas 11 is coated with an insulating material, an alignment error in the coating process causes the reserved solder mask window areas 11 to be covered and the actual solder mask window areas 11 to shift, since the auxiliary circuit 122 passes through the solder mask window area 11 and the routing-wiring direction of the each of the two auxiliary circuits is intersected the connecting-wiring direction of the two electrodes of the light-emitting units 2, the auxiliary circuit 122 is disposed long enough to avoid large-area coverage, so that during optometry, the portion that is not covered by the insulating material is monitored to serve as the bonding pad 3 for die bonding, which effectively avoids the occurrence of die bonding failure, and the quality and the performance of the LED backlight module are better improved. In this embodiment, the insulating substance is white oil.

In some embodiments, the substrate 1 is bent in a preset direction, and a horizontal direction where a radian of the substrate 1 changes after bending is a bending direction of the substrate 1, a connecting-wiring direction of the two electrodes of each of the plurality of the light-emitting units 2 is perpendicular to the bending direction of the substrate 1, and a connecting-wiring of the two electrodes of each of the plurality of light-emitting units is located on a curved surface where the substrate 1 is located, so that during the bending of the substrate 1, the stress applied to the bonding point of the light-emitting unit 2 is reduced, thereby effectively avoiding separation of soldering tin at the bonding pad 3 from the electrode of the light-emitting unit 2, reducing the occurrence of cold solder joint, decreasing defective rate, and improving overall effective performance of the backlight module.

The current packaging process generally adopts a whole-surface injection molding, after the substrate 1 has a certain degree of bending, on the one hand a stress will cause the soldering tin to be separated from the electrode of the light-emitting unit 2, which will result in cold solder joint and thus cause failure of the backlight module; on the other hand, a whole surface connected packaging adhesive is stretched after bending, which can easily cause adhesive fracture.

Figure 6:
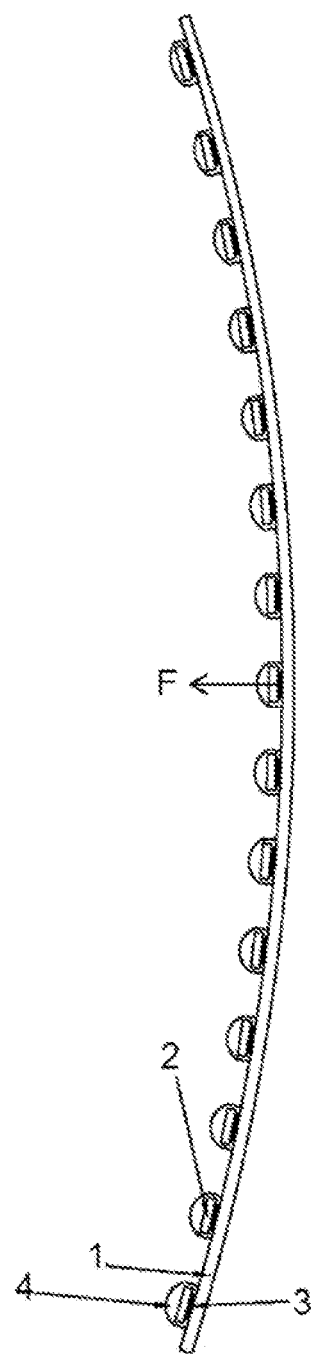
FIG. 6 illustrates a side view of an overall structure of an LED backlight module of an embodiment of the present disclosure.

As shown in FIG. 6, for this problem, in the embodiment, each of the light-emitting units 2 is covered and packaged with packaging adhesive 4, and an adhesive path track of the packaging adhesive 4 covering each of the light-emitting units 2 extends from one end of the light-emitting unit 2 to the other end, so that an adhesive path track of the packaging adhesive 4 is perpendicular to the bending direction of the substrate 1. After a curvature of the substrate 1 is reduced, a stress suffered between the light-emitting unit 2 and the packaging adhesive 4 is reduced, thereby effectively avoiding a problem of separation of the two electrodes of the light-emitting unit 2 and the soldering tin at the bonding pads 3.

In a traditional packaging mode, the packaging adhesive 4 is in a form of covering and connecting a whole surface, after the substrate 1 is bent, the packaging adhesive 4 is stretched, which easily causes the colloid fracture, so that the packaging effect is greatly reduced, and a problem of unstable fixing of the light-emitting unit 2 is easily caused. Further, referring to FIG. 5 that the plurality of light-emitting units 2 are arranged in a rectangular array on the substrate 1, the adhesive paths of the packaging adhesive covering on light-emitting units 2 arranged in the connecting-wiring direction of the two electrodes of the light-emitting units 2 are connected in an end-to-end manner so as to form a linear packaging mode. An adhesive path track of the packaging adhesive 4 is perpendicular to a bending direction of the substrate 1, so that during a bending process of the substrate 1, the adjacent two columns of the packaging adhesive 4 is no long subjected to a stretching effect in the bending direction of the substrate 1, thereby preventing the colloid fracture of the packaging adhesive 4 from occurring. Alternatively, in some embodiments, the plurality of light-emitting units 2 are arranged in an isosceles triangle on the substrate 1.

In this embodiment, a material of the packaging adhesive 4 is silicone or epoxy resin. In some embodiments, silica gel or silicone resin is adopted as the material of the packaging adhesive 4. Since silica gel has characteristics of high temperature resistance, excellent flexibility, less possibility of deforming, strong ability to withstand stretching deformation, fracture or tearing is better avoided. In this embodiment, a coating of the packaging adhesive 4 is carried out by adopting a packaging process of a scribing; in some embodiments, the packaging process adopts dispensing or integral molding, or the like.

Figure 3:
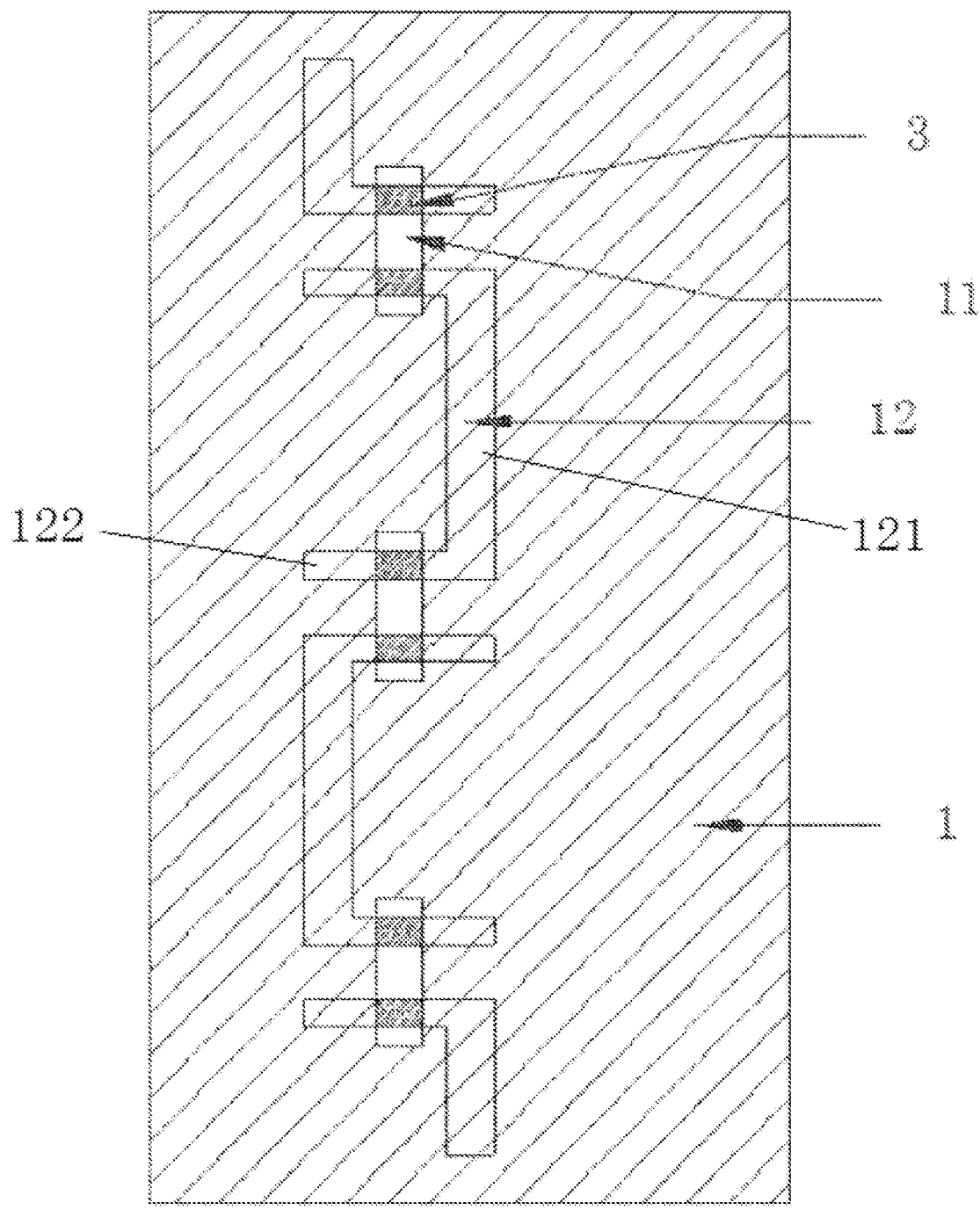
FIG. 3 illustrates a wiring diagram I of conductive circuits on a substrate of an embodiment of the present disclosure.
Figure 4:
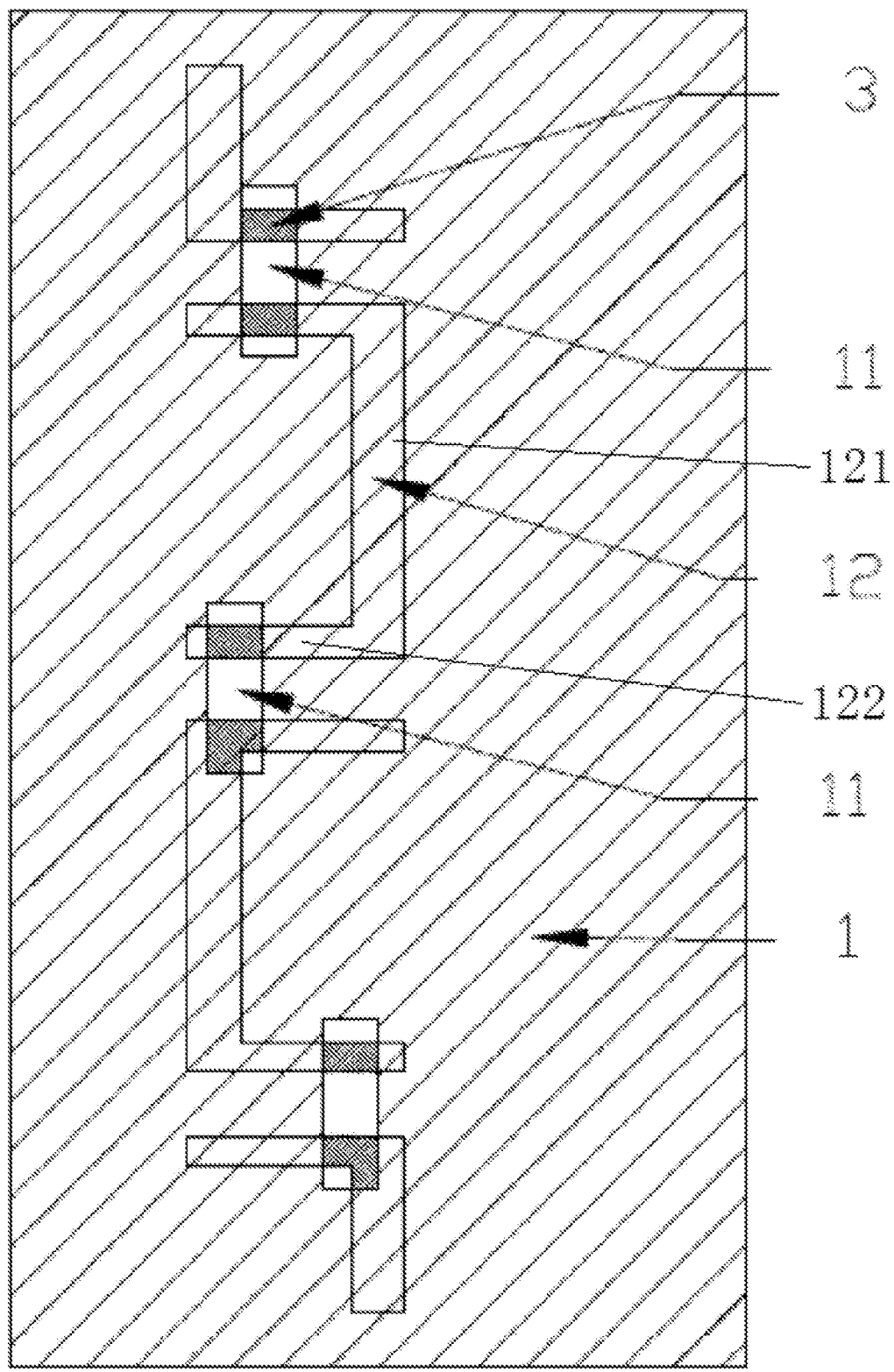
FIG. 4 illustrates a wiring diagram II of conductive circuits on a substrate of an embodiment of the present disclosure.
Figure 5:
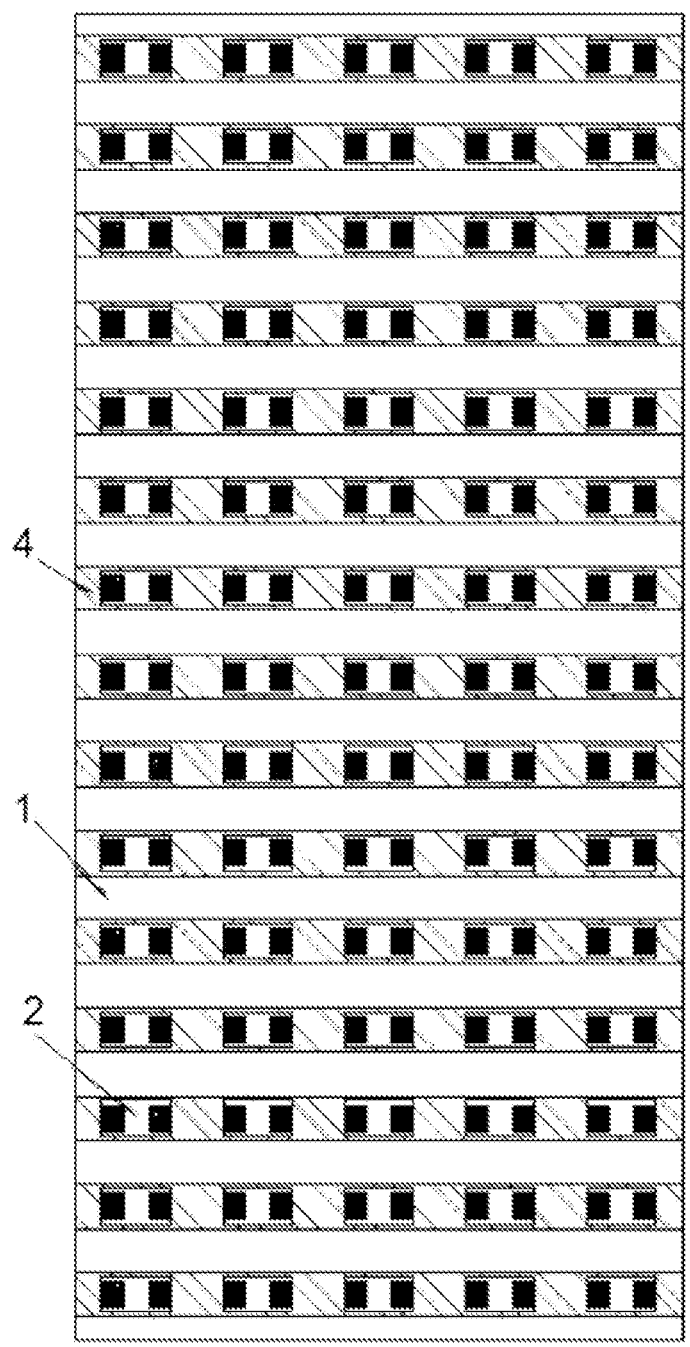
FIG. 5 illustrates a top view of an overall structure of an LED backlight module of an embodiment of the present disclosure.

According to FIG. 3, in this embodiment, a portion of the upper surface of the substrate 1 is covered with an insulating material, and a portion of the substrate 1 that is not covered by the insulating material forms a plurality of solder mask window areas 11 for the light-emitting units 2 to abut against, each of the solder mask window areas 11 has a shape the same as the cross-sectional shape of the light-emitting unit 2, and an area of each of the solder mask window areas 11 is greater than a cross-sectional area of the light-emitting unit 2; more specifically, when the light-emitting unit 2 adopts a light-emitting chip, a length of the solder mask window area 11 is 20 μm to 100 μm greater than a length of the light-emitting unit, and a width of the solder mask window area 11 is 20 μm to 100 μm greater than a width of the light-emitting unit; and each bonding pad 3 is located in the solder mask window area 11. An plurality of conductive circuits 12 connecting adjacent light-emitting units 2 are distributed on the substrate 1, a routing-wiring direction of the main circuit 121 of each of the conductive circuits 12 is the same as the connecting-wiring direction of the two electrodes of the light-emitting units 2, the main circuits 121 of the various conductive circuits 12 disposed in the connecting-wiring direction of the two electrodes of the light-emitting units 2 are distributed in a staggered manner, that is, the main circuits 121 of adjacent conductive circuits disposed in the wiring direction of the two electrodes of the light-emitting units 2 are respectively located on two sides of the light-emitting unit; in other embodiments, the main circuits 121 of the conductive circuits disposed in the connecting-wiring direction of the two electrodes of the light-emitting units 2 are located on the same side of the light-emitting unit. In some embodiments, a length of each of the auxiliary circuits 122 is disposed to at least 1.2 times a length of the electrode of each of the light-emitting units 2, and a width of each of the auxiliary circuits 122 is disposed to at least 1.2 times a width of the electrode of each of the light-emitting units 2, so as to ensure that the length of the auxiliary circuit 122 is long enough to guarantee that the metal portion of the auxiliary circuit 122 that is not covered by the insulating white oil is detected successfully during optometry to serve as the bonding pad 3 for die bonding. More specifically, as shown in FIG. 4, deviations in the vertical direction and the horizontal direction between each of the solder mask window areas 11 will not affect patches of the light-emitting units 2 and other devices on the substrate 1, and the light-emitting unit 2 is not easy to shift during the optometry and alignment process.

As a preferred embodiment of the present disclosure, the substrate 1 adopts a copper clad plate, a base material of the copper-clad plate is thermosetting epoxy resin or polyimide, a reinforcing material is glass fiber or carbon fiber, and a thickness of the copper-clad plate is less than or equal to 1.2 mm. In a more preferred case, the thickness of the copper-clad plate is less than or equal to 0.6 mm, so that the manufactured finished backlight panel can be lighter and thinner, and is easier to bend, thereby avoiding the occurrence of fracture during bending.

In this embodiment, each of the light-emitting units 2 adopts a dual-electrode chip. Further, in some embodiments, the light-emitting unit 2 adopts a multi-electrode chip. In some embodiments, a dual-electrode lamp bead, or a multi-electrode lamp bead is used to replace the light-emitting unit 2 as a light-emitting device.

The present disclosure further provides a display device, which includes the above-mentioned LED backlight module. The LED backlight module optimizes an arrangement of the light-emitting units 2 on the substrate 1 and a packaging structure, which effectively solves the problems of cold solder joint of the light-emitting unit 2 and the colloid fracture of the packaging adhesive 4 caused by the bending process of the substrate 1, and the problem of die bonding failure since the light-emitting unit 2 cannot detect the bonding pad 3 during optometry due to the alignment error in the white oil coating process, thereby greatly improving overall effective performance.

Of course, the design and creation of the present disclosure is not limited to the above embodiments, and those skilled in the art may further make equivalent variations or substitutions without departing from the spirit of the present disclosure, and these equivalent variations or substitutions are all included in the scope of the claims of the present disclosure.

What is claimed is:

1. A Light Emitting Diode (LED) backlight module comprising a substrate, a plurality of light-emitting units disposed on the substrate, wherein a surface of the substrate is provided with a plurality of solder mask window areas for the plurality of light-emitting units to abut against, the plurality of light-emitting units and the plurality of solder mask window areas are disposed in an one-to-one corresponding manner, each of the plurality of solder mask window areas is internally provided with two bonding pads connected with two electrodes of a corresponding light-emitting unit in the plurality of light-emitting units respectively, a plurality of conductive circuits are disposed on the substrate, each of the plurality of conductive circuits is connected with two adjacent light-emitting units in the plurality of light-emitting units, each of the plurality of conductive circuits comprises a main circuit and two auxiliary circuits connected with the main circuit, each of the two auxiliary circuits is extended from one side of a corresponding solder mask window area to the other side of the corresponding solder mask window area and a routing-wiring direction of the each of the two auxiliary circuits is intersected with a connecting-wiring direction of the two electrodes of the light-emitting unit, each bonding pad is located on a corresponding auxiliary circuit.

2. The LED backlight module as claimed in claim 1, wherein the routing-wiring direction of the each of the two auxiliary circuits in each of the plurality of conductive circuits is perpendicular to the connecting-wiring direction of the two electrodes of the corresponding light-emitting unit.

3. The LED backlight module as claimed in claim 1, wherein a length of each of the two auxiliary circuits in each of the plurality of conductive circuits is at least 1.2 times a length of an electrode of each of the plurality of light-emitting units; and a width of each of the two auxiliary circuits is at least 1.2 times a width of the electrode of each of the plurality of light-emitting units.

4. The LED backlight module as claimed in claim 1, wherein the substrate is bent in a preset direction, a horizontal direction where a radian of the substrate changes after bending is a bending direction of the substrate, a connecting-wiring direction of the two electrodes of each of the plurality of light-emitting units is perpendicular to the bending direction of the substrate, and a connecting-wiring of the two electrodes of each of the plurality of light-emitting units is located on a curved surface where the substrate is located.

5. The LED backlight module as claimed in claim 4, wherein each of the plurality of light-emitting units is covered and packaged with a packaging adhesive respectively.

6. The LED backlight module as claimed in claim 5, wherein the plurality of light-emitting units are arranged in a rectangular or isosceles triangle array on the substrate, and adhesive paths of the packaging adhesives covering on light-emitting units arranged in the connecting-wiring direction of the two electrodes of the light-emitting units are connected in an end-to-end manner.

7. The LED backlight module as claimed in claim 6, wherein a material of the packaging adhesive is silicone or epoxy resin.

8. The LED backlight module as claimed in claim 1, wherein an area of each of the plurality of solder mask window areas is larger than a cross-sectional area of a corresponding light-emitting unit in the plurality of light-emitting units.

9. The LED backlight module as claimed in claim 8, wherein a length of the solder mask window area is 20 μm to 100 μm greater a length of the corresponding light-emitting unit; and a width of the solder mask window area is 20 μm to 100 μm greater than a width of the corresponding light-emitting unit.

10. The LED backlight module as claimed in claim 1, wherein the substrate adopts a copper clad plate; a base material of the copper clad plate is thermosetting epoxy resin or polyimide, and a reinforcing material is glass fiber or carbon fiber.

11. The LED backlight module as claimed in claim 10, wherein a thickness of the copper clad plate is less than or equal to 1.2 mm.

12. The LED backlight module as claimed in claim 1, wherein each of the light-emitting units adopts a dual-electrode chip.

13. A display device, comprising the LED backlight module as claimed in claim 1.

14. The display device as claimed in claim 13, wherein the routing-wiring direction of the each of the two auxiliary circuits in each of the plurality of conductive circuits is perpendicular to the connecting-wiring direction of the two electrodes of the corresponding light-emitting unit.

15. The display device as claimed in claim 13, wherein a length of each of the two auxiliary circuits in each of the plurality of conductive circuits is at least 1.2 times a length of an electrode of each of the plurality of light-emitting units; and a width of each of the two auxiliary circuits is at least 1.2 times a width of the electrode of each of the plurality of light-emitting units.

16. The display device as claimed in claim 13, wherein the substrate is bent in a preset direction, a horizontal direction where a radian of the substrate changes after bending is a bending direction of the substrate, a connecting-wiring direction of the two electrodes of each of the plurality of light-emitting units is perpendicular to the bending direction of the substrate, and a connecting-wiring of the two electrodes of each of the plurality of light-emitting units is located on a curved surface where the substrate is located.

17. The display device as claimed in claim 16, wherein each of the plurality of light-emitting units is covered and packaged with a packaging adhesive respectively.

18. The display device as claimed in claim 17, wherein the plurality of light-emitting units are arranged in a rectangular or isosceles triangle array on the substrate, and adhesive paths of the packaging adhesives covering on light-emitting units arranged in the connecting-wiring direction of the two electrodes of the light-emitting units are connected in an end-to-end manner.

19. The display device as claimed in claim 18, wherein a material of the packaging adhesive is silicone or epoxy resin.

20. The display device as claimed in claim 13, wherein an area of each of the plurality of solder mask window areas is larger than a cross-sectional area of a corresponding light-emitting unit in the plurality of light-emitting units.

* * * * *